United States Patent
Kaelberer et al.

(10) Patent No.: US 9,790,084 B2
(45) Date of Patent: Oct. 17, 2017

(54) MICROMECHANICAL SENSOR DEVICE

(71) Applicant: Robert Bosch GmbH, Stuttgart (DE)

(72) Inventors: Arnd Kaelberer, Schlierbach (DE); Jochen Reinmuth, Reutlingen (DE)

(73) Assignee: ROBERT BOSCH GMBH, Stuttgart (DE)

( * ) Notice: Subject to any disclaimer, the term of this patent is extended or adjusted under 35 U.S.C. 154(b) by 340 days.

(21) Appl. No.: 14/536,091

(22) Filed: Nov. 7, 2014

(65) Prior Publication Data
US 2015/0128703 A1  May 14, 2015

(30) Foreign Application Priority Data

Nov. 8, 2013  (DE) .................. 10 2013 222 733

(51) Int. Cl.
| | |
|---|---|
| G01P 15/00 | (2006.01) |
| G01C 19/00 | (2013.01) |
| B81B 7/00 | (2006.01) |
| G01P 15/08 | (2006.01) |
| B81C 1/00 | (2006.01) |

(52) U.S. Cl.
CPC ........ B81B 7/0048 (2013.01); B81C 1/00238 (2013.01); G01P 15/0802 (2013.01); *B81B 2201/0235* (2013.01); *B81B 2201/0242* (2013.01); *B81B 2207/012* (2013.01); *B81B 2207/096* (2013.01); *B81C 2203/0792* (2013.01); *G01P 2015/0882* (2013.01)

(58) Field of Classification Search
CPC .............. B81B 7/0032; G01C 19/5733; G01C 19/5769
See application file for complete search history.

(56) References Cited

U.S. PATENT DOCUMENTS

| | | | |
|---|---|---|---|
| 2006/0199365 A1* | 9/2006 | Wilner | H01L 21/76898 438/618 |
| 2010/0109102 A1 | 5/2010 | Chen et al. | |
| 2010/0290199 A1* | 11/2010 | Schmid | B81C 1/0023 361/752 |
| 2012/0049299 A1 | 3/2012 | Chou | |
| 2012/0306038 A1* | 12/2012 | Chow | H01L 27/14618 257/434 |
| 2013/0250532 A1* | 9/2013 | Bryzek | B81C 1/0023 361/760 |
| 2014/0117472 A1* | 5/2014 | Gonska | B81C 1/00285 257/415 |

* cited by examiner

*Primary Examiner* — Jill Culler
*Assistant Examiner* — Ruben Parco, Jr.
(74) *Attorney, Agent, or Firm* — Norton Rose Fulbright US LLP; Gerard Messina

(57) ABSTRACT

A micromechanical sensor device includes an evaluation circuit formed in a first substrate, and an MEMS structure which is situated in a cavity delimited by a second substrate and a third substrate, the MEMS structure and the second substrate being situated on top of each other, the MEMS structure being functionally connected to the evaluation circuit via a contact area, the contact area between the MEMS structure and the first substrate being situated essentially centrally on the second substrate and essentially centrally on the first substrate and has an essentially punctiform configuration, proceeding radially from the contact area, a clearance being formed between the first substrate and the second substrate.

16 Claims, 4 Drawing Sheets

MICROMECHANICAL SENSOR DEVICE

RELATED APPLICATION INFORMATION

The present application claims priority to and the benefit of German patent application no. 10 2013 222 733.7, which was filed in Germany on Nov. 8, 2013, the disclosure of which is incorporated herein by reference.

FIELD OF THE INVENTION

The present invention relates to a micromechanical sensor device. The present invention further relates to a method for manufacturing a micromechanical sensor device.

BACKGROUND INFORMATION

There are believed to be rotation rate sensors that have caverns in which different pressures are enclosed.

FIG. 1 shows a such a micromechanical sensor device 100. A very low pressure is enclosed in cavern 3, typically 1 mbar. The background for this measure is that some of movable MEMS structures 5, 6 are resonantly driven in these sensors. At a low pressure, it is thus easy to excite oscillations using relatively low voltages due to the low damping.

In the case of acceleration sensors, in contrast, it is not desirable that the sensor begins to oscillate, which would be possible if an externally present oscillation or external pulse-shaped acceleration were present. These sensors are therefore operated at higher internal pressures, typically at approximately 500 mbar.

If very small and cost-effective combinations of rotation rate and acceleration sensors are to be created, this may be carried out by providing both an MEMS structure 5 of a rotation rate sensor and an MEMS structure 5 of an acceleration sensor on one chip of sensor device 100. The two sensors are created simultaneously on one substrate 1. The sensors are encapsulated at the substrate level with the aid of a cap wafer 2, which provides two caverns 3, 4 per chip.

The different pressures which are required in caverns 3, 4 of the rotation rate sensor and of the acceleration sensor may be achieved by using a getter layer 6, for example. A getter layer 6 is locally situated in cavern 4 of the rotation rate sensor. A high pressure is then enclosed in the two caverns 3, 4. Subsequently, getter layer 6 is activated with the aid of a temperature step, whereby getter layer 6 then "pumps," or getters, the cavern volume over the rotation rate sensor to a lower pressure.

However, this method is comparatively complex and expensive. A porous layer having a very large surface must be created as getter layer 6, which initially must be sealed. Getter layer 6 must not be activated until caverns 3, 4 have been sealed; this means that the seal is broken open with the aid of a temperature step.

Moreover, manufacturing methods for rotation rate sensors and acceleration sensors including an integrated evaluation circuit (CMOS circuit), which is shown schematically in FIG. 2, for example, are known. For example, a structured oxide layer 11 is provided on a first substrate 10 in the form of a CMOS wafer, onto which a monocrystalline functional layer is bonded. An electrical connection 7 is established between the functional layer and the CMOS circuit with the aid of a trench process and filling with a conductive material. The functional layer is structured via a further trench step, and free-standing MEMS structures 5 are created, whose movement may be capacitively excited or detected, for example.

The functional layer is subsequently hermetically sealed with a cap wafer 2. Depending on the application, a suitable pressure is enclosed within the closed volume. Contact surfaces with first substrate 10 are exposed to relay the ASIC signal via bonding wires and a suitable housing. A corresponding method is known from US 20100109102 A1, for example.

If very small sensors are to be created, a housing may also be omitted, and the ASIC MEMS chip may be directly soldered onto a printed circuit board, whereby a so-called bare die system is implemented. To establish the direct solderability, however, the ASIC signal must be conducted through the ASIC wafer to the ASIC wafer rear side via an electrical via 12. There, a rewiring plane 13 is usually provided to then transmit the ASIC signal via solder bumps 14, which are also provided on the rear side, to the printed circuit board (not shown). A corresponding sensor is known from US 20120049299 A1, for example.

It is also possible, however, to manufacture the vias 12 shown in FIG. 2 so that they are only very thin for technological reasons, as a result of which the entire first substrate 10 has only a very thin configuration. The free-standing MEMS structures are anchored on first substrate 10 in the form of the ASIC wafer. Since the ASIC wafer is very thin, external mechanical stresses which are caused by different coefficients of expansion of the printed circuit board and of the ASIC wafer may easily bend MEMS structures 5 and thus lead to strong false signals in the sensor.

SUMMARY OF THE INVENTION

It is therefore an object of the present invention to provide an improved micromechanical sensor device.

According to a first aspect, the object is achieved by a micromechanical sensor device, including:

an evaluation circuit formed in a first substrate; and
an MEMS structure which is situated in a cavity delimited by a second substrate and a third substrate, the MEMS structure and the second substrate being situated on top of each other, the MEMS structure being functionally connected to the evaluation circuit via a contact area, characterized in that the contact area between the MEMS structure and the first substrate is situated essentially centrally on the second substrate and essentially centrally on the first substrate, and has an essentially punctiform configuration, proceeding radially from the contact area, a clearance being formed between the first substrate and the second substrate.

According to a second aspect, the object is achieved by a method for manufacturing a micromechanical sensor device, including the following steps:

forming an evaluation circuit in a first substrate;
forming an MEMS structure in a cavity which is delimited by a second substrate and by a third substrate; and
forming a contact area between the MEMS structure and the evaluation circuit in such a way that, proceeding radially from the contact area, a clearance is formed between the first substrate and the second substrate.

Advantageously, an essentially punctiform connection is established between the MEMS structure of the inertial sensor and the evaluation circuit with the aid of the concept according to the present invention. In this way, advantageously essentially no mechanical stress is transmittable to the sensitive micromechanical functional layers of the inertial sensor.

Specific embodiments of the sensor device according to the present invention and of the method according to the present invention are the subject matter of subclaims.

One specific embodiment of the sensor device according to the present invention is characterized in that the evaluation circuit is contacted with solder bumps, with the aid of which the sensor device may be contacted on a printed circuit board. In this way, a flip-chip system is provided, with the aid of which a reliable and simple electrical contacting option with an application printed circuit board is possible.

A further specific embodiment of the sensor device according to the present invention is characterized in that the evaluation circuit is situated on an upper side or on a lower side of the first substrate. In this way, advantageously different options for situating the evaluation circuit on the first substrate are achieved.

A further specific embodiment of the sensor device according to the present invention is characterized in that the functional connection between the MEMS structure and the evaluation circuit is configured as an electrically conducting connection made of highly doped silicon of the second substrate. In this way, an electrically conducting connection may be provided particularly easily between the MEMS structure of the inertial sensor and the evaluation circuit on the first substrate.

A further specific embodiment of the sensor device according to the present invention provides for a ventilation channel to be situated within the electrically conducting connection, the ventilation channel having an access to a cavern including an MEMS structure. In this way, a simple and cost-effective ventilation option is created, with the aid of which a defined internal pressure is settable in one of the caverns of the MEMS structure. Advantageously, a complex use of a getter material is thus dispensed with.

According to a further specific embodiment of the sensor device according to the present invention, it is provided that a circumferential sealing ring, which is narrow in relation to the lateral dimension of the sensor device, is formed around the contact area. In this way, advantageously what may be a small-surface-area contact is provided between the first substrate and the MEMS structure, whereby favorable mechanical force transmission conditions are created. In particular in the case of different internal pressures, the process of providing different internal pressures in different caverns is thus also facilitated.

A further specific embodiment of the sensor device according to the present invention provides for the MEMS structure to include an additional functional layer, which is electrically contacted with the conducting connection. In this way, a further alternative electrical contacting option between the micromechanical functional layer and the evaluation circuit is provided.

A further specific embodiment of the sensor device according to the present invention provides for a protective material to be situated at least in sections on a surface of the sensor device between the first substrate and the second substrate. In this way, advantageously a protective material for further processing of the sensor device is provided, which makes it possible to carry out the further processing (e.g., with the aid of a sawing process) of the sensor device in a gentle manner. In this way, the sensitive silicon material of the sensor device may in particular be protected during assembly of the application printed circuit board.

According to a further specific embodiment of the sensor device according to the present invention, it is provided that at least one of the two substrates has a thick configuration in relation to a thickness of the first substrate. In this way, the second substrate may in particular be configured to be thick, whereby stable mounting of the sensitive micromechanical functional layer, which responds highly sensitively to bending, is supported.

According to a further specific embodiment of the sensor device according to the present invention, it is provided that the clearance has a defined clear opening. In this way, defined play may be provided between the second substrate and the first substrate, which allows greater stress decoupling. In this way, the clearance between the second substrate and the first substrate may in particular be easily cleaned, whereby the stress decoupling action may be uniform.

The present invention is described in greater detail with further features and advantages based on several figures. All described or illustrated features, either alone or in any arbitrary combination, form the subject matter of the present invention, regardless of their summary in the patent claims or their back reference, and regardless of their wording or representation in the description or in the figures. The figures are primarily intended to illustrate the principles that are essential to the present invention. Identical or functionally equivalent elements are denoted by identical reference numerals.

DETAILED DESCRIPTION

Figure 1:
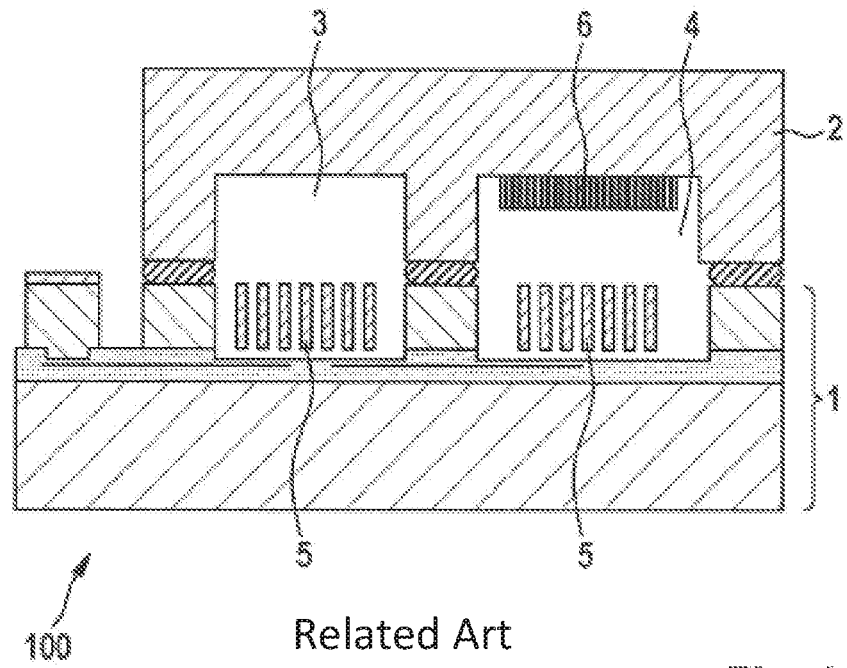
FIG. 1 shows a conventional micromechanical sensor device.
Figure 2:
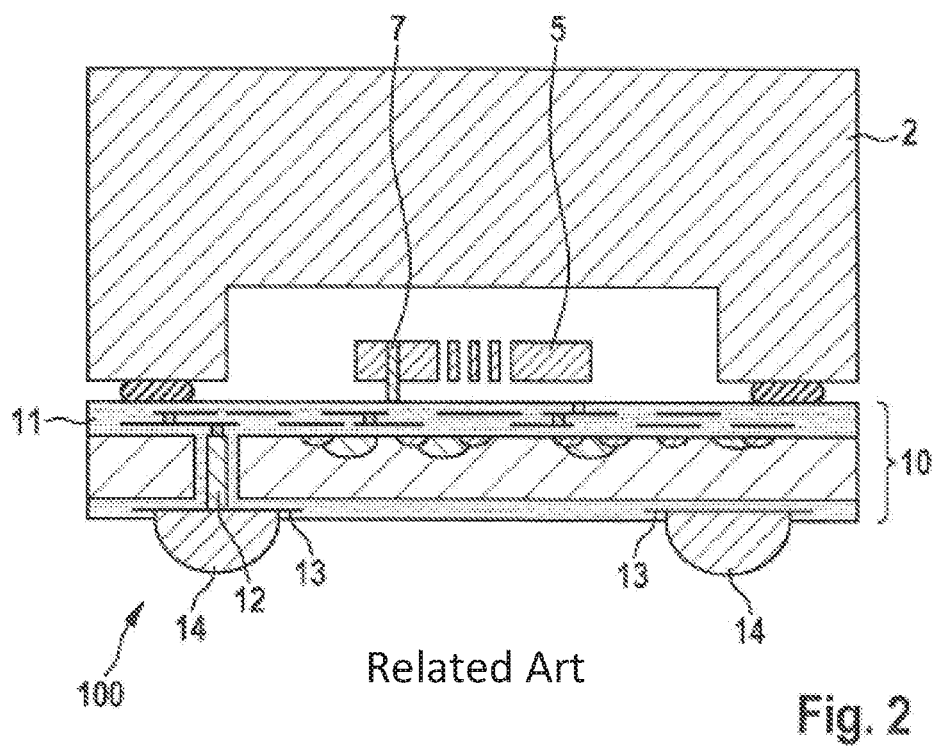
FIG. 2 shows a further conventional micromechanical sensor device.
Figure 3:
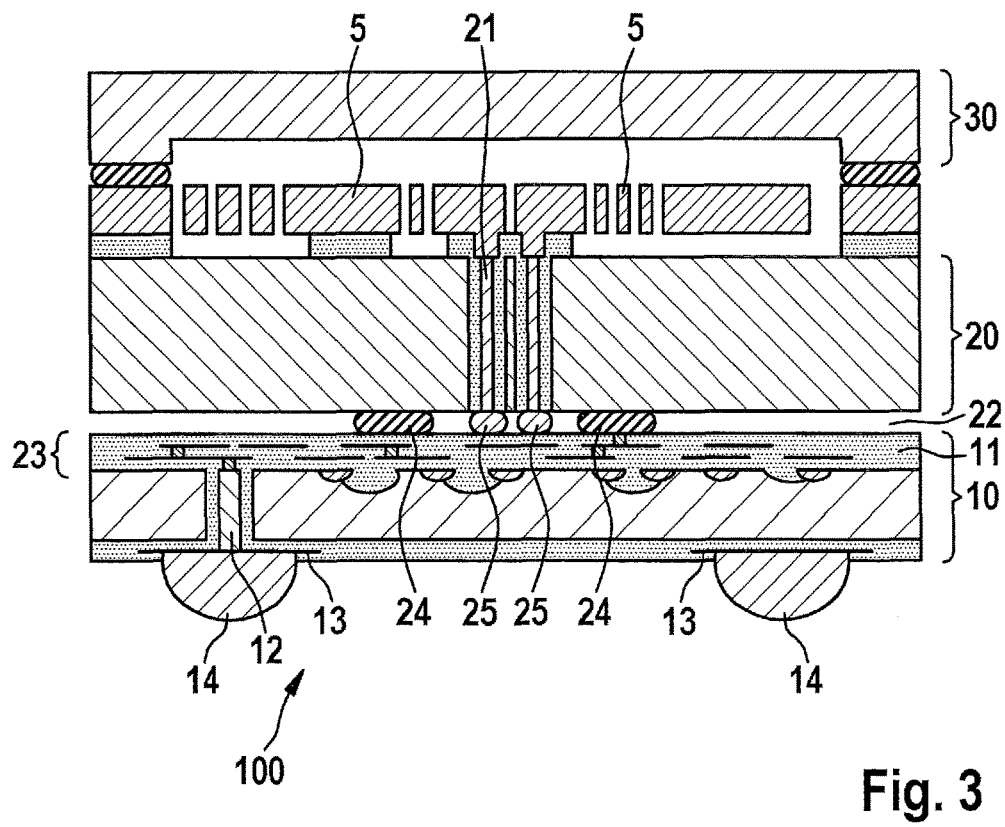
FIG. 3 shows a first specific embodiment of the sensor device according to the present invention.

FIG. 3 shows a schematic sectional view of a first specific embodiment of sensor device 100 according to the present invention. Sensor device 100 includes a first substrate 10 on which an evaluation circuit 23 is situated. A cavity in which a movable MEMS structure 5 is hermetically enclosed is formed by a second substrate 20 and a third substrate 30. An electrical signal of MEMS structure 5 is conducted through an electrical via 21 through second substrate 20 to evaluation circuit 23 of first substrate 10. The described connection between the first and the second substrate is configured in such a way that a central contact area 25 is formed, whereby the connection does not take place over the entire chip surface, but essentially at the center of the "sandwich" made of the first and second substrate and centrally on first substrate 10. In this way, a clearance 22 having a defined clear opening is formed partially on the chip edge, as a result of which first substrate 10 may bend in this area, without the bending being transmitted to second substrate 20.

Deformations of the application printed circuit board (not shown) are thus not able to affect sensitive MEMS structures 5, whereby an efficient stress decoupling measure is implemented.

Evaluation circuit 23, which may be configured using CMOS technology, may be provided on first substrate 10 on the side facing second substrate 20. Electrical signals may be conducted via electrical vias 12 in the form of through silicon vias (TSVs) to the rear side of first substrate 10, and there they may be conducted over a rewiring plane 13 or directly to solder bumps 14. After the components have been separated, they may be soldered onto the application printed circuit board with the aid of solder bumps 14.

As an alternative, evaluation circuit 23 may also be situated on the side of first substrate 10 which faces away from second substrate 20 (not shown). In this case, the MEMS signal is conducted via electrical vias 12 through first substrate 10 to evaluation circuit 23. A rewiring plane 13 may also be provided on the side facing second substrate 20 to be able to flexibly situate the electrical contacts between the first and the second substrate.

It is favorable to form the connections between the first and the second substrate which may be centrally and small, i.e., on a small surface area, i.e., essentially in a what may be a punctiform manner on each of two substrates 10, 20, to achieve efficient mechanical stress decoupling between the application printed circuit board and MEMS structure 5.

For this purpose, it is further also favorable to configure at least one of two substrates 20, 30 to be thick. This is because it has been found that the total thickness of two substrates 20, 30 should be at least approximately 200 μm.

It is furthermore favorable to hermetically enclose and protect the electrical contacts between first substrate 10 and second substrate 20 with the aid of one or multiple sealing rings 24, which circumferentially protect contact area 25.

Figure 4:
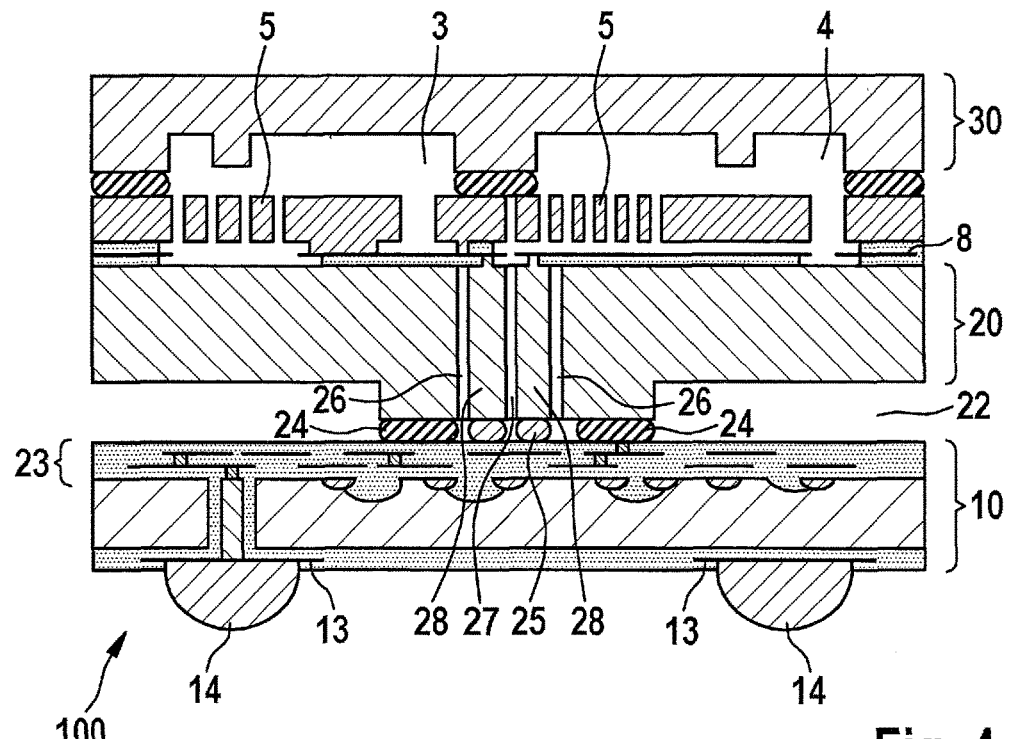
FIG. 4 shows a further specific embodiment of the micromechanical sensor device according to the present invention.

In one variant shown in FIG. 4, it may be provided that a highly doped and thus electrically conductive silicon substrate is used as second substrate 20. The electrical signal of movable MEMS structures 5 may then be conducted through a subarea of second substrate 20, which is electrically separated from the remaining substrate by insulating trenches 26. Due to insulating trenches 26, electrically conducting Si dies 28 are formed.

In this case, advantageously no additional depositions of conductive material are required to be able to conduct the electrical signal through second substrate 20. For this purpose, it may be favorable to achieve insulation of the signal-conducting silicon areas in second substrate 20 by first joining the second and the third substrate, and thereafter etching the insulating trenches 26 into second substrate 20 around the signal-conducting areas.

In this case, it is particularly favorable to protect the electrical contacts between first substrate 10 and second substrate 20 by a circumferential sealing ring 24. In this way, insulating trenches 26 are also hermetically protected and do not have to be protected by additional measures.

It is favorable to use a eutectic bonding method as the bonding method between the first and the second substrate, since this method implements electrically conducting connections. In particular, it is favorable to use an aluminum-germanium (AlGe) layer for the described bond connection.

It is favorable to use the aluminum which is present on most ASIC circuits as the first material for the eutectic connection and to provide germanium on the second substrate as the second partner for the described eutectic connection.

It is furthermore advantageous to provide either a depression in the first or in the second substrate and/or an additional elevation on the first or second substrate, so that a gap height or a clear opening of clearance 22 between the first and the second substrate is increased to be able to set an effective distance in this area in this way.

A particularly favorable system may be achieved when the described step provides for etching into second substrate 20 simultaneously with the structuring of the germanium layer on second substrate 20. In this way, no additional steps are required to generate the step.

FIG. 4 furthermore shows that, in the event that two MEMS structures 5 are operated at different internal pressures, two MEMS structures 5 are enclosed in caverns 3, 4 between the second and the third substrate which are hermetically separated from each other. Initially, an optimal internal pressure for first MEMS structure 5 is set in first cavern 3 by bonding second substrate 20 to third substrate 30. Together with the creation of insulating trenches 26, a ventilation channel 27 to second cavern 4 for second MEMS structure 5 may simultaneously be created.

The described ventilation step does not necessarily have to take place together with the creation of insulating trenches 26, but makes the ventilation measure more cost-effective. The bonding method between first substrate 10 and the "sandwich" composed of the second and third substrate is then used to set the setpoint internal pressure for second cavern 4 via ventilation channel 27.

Figure 5:
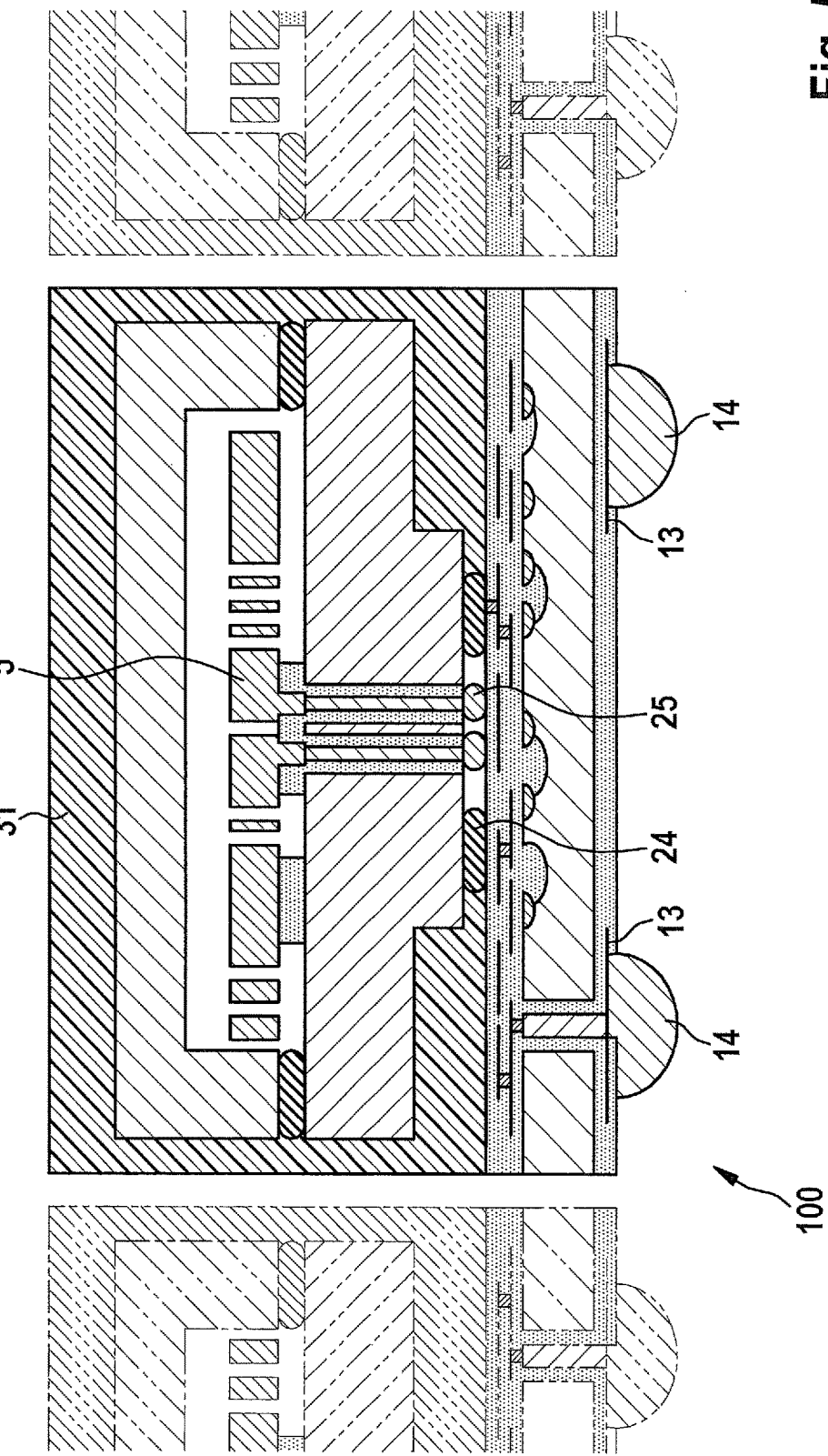
FIG. 5 shows a further specific embodiment of the micromechanical sensor device according to the present invention.

In one variant of sensor device 100, it may also be favorable to temporarily or permanently seal clearance 22 for stress decoupling at the chip edge between first substrate 10 and second substrate 20, as is indicated in FIG. 5.

Temporary sealing of clearance 22 or of the gap allows the gap to be protected during further processing, so that it is not possible for small particles to enter the gap and in this way disadvantageously reduce the stress decoupling. For this purpose, organic lacquers may be used, for example, which dissolve on their own when temperatures increase due to gas formation in the lacquer. Prior to separating the substrate stack, the substrate stack may advantageously be opened to the gap from the front side or the rear side, for example, with the aid of a cost-effective sawing process. The gap is subsequently filled with a protective material 31 (e.g., lacquer), cured, and the chips are separated. It is not until the point in time when the chips are soldered onto the application printed circuit board that the lacquer dissolves under the high soldering temperature. The lacquer may also be used to protect the side wall and also its surface during further processing.

As an alternative to the dissolving lacquer, it may also be favorable to permanently protect at least a subarea of clearance 22 by a viscous material (e.g., a gel, viscose material, or the like, which is not shown). In this case, it may also be favorable to configure clearance 22 to be relatively narrow, so that viscous protective material 31 protects clearance 22 only at the edge from impurities, but otherwise advantageously has only little influence on the stress decoupling.

Figure 6:
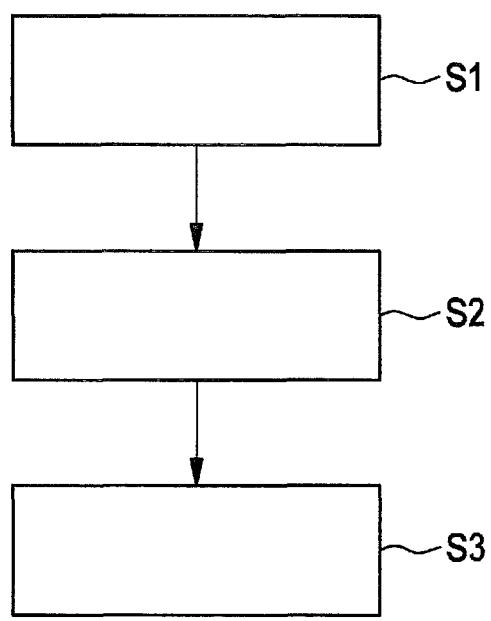
FIG. 6 shows a schematic flow of one specific embodiment of the method according to the present invention.

FIG. 6 shows a schematic flow of one specific embodiment of the method according to the present invention.

In a first step S1, an evaluation circuit is formed in a first substrate 10.

In a second step S2, an MEMS structure is formed in a cavity which is delimited by a second substrate and by a third substrate.

Finally, in a third step S3, a contact area is formed between the MEMS structure and the evaluation circuit in such a way that, proceeding radially from the contact area, a clearance is formed between the first substrate and the second substrate.

In summary, the present invention provides a sensor device and a method for manufacturing a sensor device, which make it possible to implement stress decoupling for micromechanical sensor devices in a cost-effective manner. Due to the specific configuration and arrangement of an essentially punctiform joint area between the substrates, it is advantageously possible to largely prevent an effect of mechanical stress on the MEMS structures. Due to the essentially punctiform joint of the substrates, the side areas of first substrate 10 advantageously act like physical springs, which absorb or at least dampen the undesirable mechanical forces or oscillations.

While the present invention was described based on concrete exemplary embodiments, those skilled in the art may of course modify the named features or combine them with each other, without departing from the core of the present invention.

What is claimed is:

1. A micromechanical sensor device, comprising: an evaluation circuit formed in a first substrate; and
    an MEMS structure which is situated in a cavity delimited by a second substrate and a third substrate, the MEMS structure being situated on top of the second substrate, the MEMS structure being functionally connected to the evaluation circuit via a contact area;
    wherein the contact area between the MEMS structure and the first substrate is situated essentially centrally on the second substrate and essentially centrally on the first substrate and has an essentially punctiform configuration;
    wherein a clearance, proceeding radially from the contact area, is formed between the first substrate and the second substrate;
    wherein the MEMS structure is functionally connected to the evaluation circuit via an electrically conducting connection made of highly doped silicon of the second substrate: and wherein the clearance has a defined clear opening,
    wherein the electrically conducting connection is delimited by insulating trenches,
    wherein the insulating trenches are hollow through channels situated in the second substrate;
    wherein the electrically conducting connection has a first electrically conducting connection section and a second electrically conducting connection section;
    wherein the first electrically conducting connection is delimited by a first hollow through channel and a ventilation channel which has an access to a cavern including an MEMS structure; and
    wherein the second electrically conducting connection is delimited by a second hollow through channel and the ventilation channel.

2. The sensor device of claim 1, wherein the evaluation circuit is contacted with solder bumps, with the aid of which the sensor device is contactable on a printed circuit board.

3. The sensor device of claim 1, wherein the evaluation circuit is situated on an upper side or on a lower side of the first substrate.

4. The sensor device of claim 1,
    wherein the electrically conducting connection is delimited by insulating trenches; and
    wherein a ventilation channel which has an access to a cavern including an MEMS structure is situated between the insulating trenches that delimit the electrically conducting connection.

5. The sensor device of claim 1, wherein a circumferential sealing ring, which is narrow in relation to the lateral dimension of the sensor device, is formed around the contact area.

6. The sensor device of claim 1, wherein the MEMS structure includes an additional functional layer, which is electrically contacted with the electrically conducting connection.

7. The sensor device of claim 1, wherein a protective material is able to be inserted at least in sections on a surface of the sensor device between the first substrate and the second substrate.

8. The sensor device of claim 1, wherein at least one of the second and third substrates has a thick configuration in relation to a thickness of the first substrate.

9. The sensor device of claim 1, wherein the contact area is a eutectic bond formed using a eutectic bonding method.

10. The sensor device of claim 1, wherein the insulating trenches are hollow through channels situated in the second substrate.

11. The device of claim 1, wherein the defined clear opening radially extends to an outer surface of the micromechanical sensor device.

12. A method for manufacturing a micromechanical sensor device, the method comprising:
    forming an evaluation circuit in a first substrate;
    forming an MEMS structure in a cavity which is delimited by a second substrate and by a third substrate; and
    forming a contact area between the MEMS structure and the evaluation circuit so that, proceeding radially from the contact area, a clearance is formed between the first substrate and the second substrate;
    wherein the MEMS structure is functionally connected to the evaluation circuit via an electrically conducting connection made of highly doped silicon of the second substrate; and
    wherein the clearance has a defined clear opening,
    wherein the contact area is a eutectic bond formed using a eutectic bonding method,
    wherein the insulating trenches are hollow through channels situated in the second substrate;
    wherein a ventilation channel which has an access to a cavern including an MEMS structure is situated between the insulating trenches that delimit the electrically conducting connection;
    wherein the electrically conducting connection has a first electrically conducting connection section and a second electrically conducting connection section;
    wherein the first electrically conducting connection is delimited by a first hollow through channel and the ventilation channel; and
    wherein the second electrically conducting connection is delimited by a second hollow through channel and the ventilation channel.

13. The method of claim 12, wherein a ventilation channel is formed within the highly doped silicon having an access to a cavern including an MEMS structure.

14. The method of claim 12, wherein the electrically conducting connection is delimited by insulating trenches.

15. The method of claim 12, wherein the insulating trenches are hollow through channels situated in the second substrate.

16. The method of claim 12, wherein the defined clear opening radially extends to an outer surface of the micromechanical sensor device.

* * * * *